(12) United States Patent
Komoto et al.

(10) Patent No.: US 12,355,169 B2
(45) Date of Patent: Jul. 8, 2025

(54) SHEET TYPE CONDUCTIVE MEMBER, CONNECTOR, GARMENT, AND CONNECTOR MOUNTING METHOD

(71) Applicant: Japan Aviation Electronics Industry, Limited, Tokyo (JP)

(72) Inventors: Tetsuya Komoto, Tokyo (JP); Akihiko Fushimi, Aichi (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 256 days.

(21) Appl. No.: 18/308,046

(22) Filed: Apr. 27, 2023

(65) Prior Publication Data

US 2024/0030630 A1  Jan. 25, 2024

(30) Foreign Application Priority Data

Jul. 20, 2022 (JP) ................. 2022-115438

(51) Int. Cl.
*H01R 12/59* (2011.01)
(52) U.S. Cl.
CPC .................. *H01R 12/59* (2013.01)

(58) Field of Classification Search
CPC ........ A41D 1/005; H01R 12/59; H01R 12/65; H01R 12/7011; H01R 12/778; H01R 13/02; H01R 13/40; H05K 1/118; H05K 1/189; H05K 2201/09063; H05K 2201/10189
See application file for complete search history.

(56) References Cited

U.S. PATENT DOCUMENTS

| | | | | |
|---|---|---|---|---|
| 3,325,768 A | * | 6/1967 | Munroe | H01R 24/76 439/441 |
| 2021/0104824 A1 | | 4/2021 | Hashiguchi et al. | |

FOREIGN PATENT DOCUMENTS

| | | | | |
|---|---|---|---|---|
| CN | 103458745 A | * | 12/2013 | ............. A47J 27/21 |
| CN | 112467412 A | * | 3/2021 | ........... H01R 12/592 |
| JP | 202161225 A | | 4/2021 | |

* cited by examiner

*Primary Examiner* — Jean F Duverne
(74) *Attorney, Agent, or Firm* — Muncy, Geissler, Olds & Lowe, P.C.

(57) ABSTRACT

A sheet type conductive member includes a flexible conductor formed of a conductive thread embroidered on or woven into a sheet body, the flexible conductor including a first end portion disposed to be superposed on a wiring portion of a garment, a second end portion electrically connected to a contact, and a joint portion joining the first end portion and the second end portion together, the sheet body having an opening portion used for attachment to a connector, the second end portion extending from its connection portion with the joint portion toward an edge of the opening portion and being disposed near the opening portion to be spaced from the edge by a predetermined distance.

17 Claims, 13 Drawing Sheets

SHEET TYPE CONDUCTIVE MEMBER, CONNECTOR, GARMENT, AND CONNECTOR MOUNTING METHOD

BACKGROUND OF THE INVENTION

The present invention relates to a sheet type conductive member, particularly to a sheet type conductive member that is attached to a connector mounted on a mounting object such as a garment and that electrically connects a wiring portion of the mounting object to a contact of the connector.

The present invention also relates to a connector having the sheet type conductive member, a garment having the connector mounted thereon, and a connector mounting method for mounting the connector on a garment.

In recent years, attention has been drawn to so-called smart clothes that can obtain user's biological data such as the heart rate and the body temperature only by being worn by the user. Such smart clothes has an electrode disposed at a measurement site, and when a wearable device serving as a measurement device is electrically connected to the electrode, biological data can be transmitted to the wearable device.

The electrode and the wearable device can be interconnected by, for instance, use of a connector connected to a wiring portion drawn from the electrode.

As a connector of this type, for example, JP 2021-61225 A discloses a connector 1 as illustrated in FIG. 21. The connector 1 has the structure in which plural contacts 3 are retained on a first insulator 2, and a tab sheet 5, a sheet type conductive member 6, and a support sheet 7 are sandwiched and retained between the first insulator 2 and a second insulator 4.

The connector 1 is attached to a garment 8 by fixing the tab sheet 5 to the garment 8.

The sheet type conductive member 6 is provided at its central portion with a cut 6A used to attach the sheet type conductive member 6 to the connector 1, and one end portions of plural flexible conductors 6B are disposed in a bilaterally symmetrical manner on the opposite sides of the cut 6A across the cut 6A on a surface of the sheet type conductive member 6. Those one end portions of the flexible conductors 6B are arranged with narrow pitch the same as the arrangement pitch of the contacts 3 so as to be connected to the contacts 3.

When the sheet type conductive member 6 is attached to the connector 1, the one end portion of each flexible conductor 6B makes contact with and is connected to the corresponding contact 3, and the other end portion thereof is connected to a conductive wiring portion (not shown) disposed on the garment 8.

Consequently, electrodes of the garment 8 disposed at measurement sites are electrically connected to the contacts 3 of the connector 1 via the wiring portions and the flexible conductors 6B.

When the sheet type conductive member 6 as shown in FIG. 21 is manufactured, plural flexible conductors extending in parallel are formed on a sheet body, and then the middle portions of the respective flexible conductors are cut together with the sheet body, thereby simultaneously forming the cut 6A and the one end portions of the flexible conductors 6B disposed in a bilaterally symmetrical manner on the opposite sides of the cut 6A.

However, in the case where the flexible conductors 6B are formed of conductive threads embroidered on or woven into the sheet body, when the middle portions of the plural conductive threads extending in parallel are cut, cut ends of the conductive threads are to be situated on the edges of the cut 6A. If the cut ends of the conductive threads are frayed accordingly, adjacent contacts 3 may short-circuit via conductive fibers of the frayed ends when the one end portions of the flexible conductors 6B are brought into contact with and electrically connected to the contacts 3.

SUMMARY OF THE INVENTION

The present invention has been made to overcome the conventional problem as above and aims at providing a sheet type conductive member capable of ensuring the reliability of electrical connection despite having a flexible conductor formed of a conductive thread.

The present invention also aims at providing a connector having the sheet type conductive member, a garment having the connector mounted thereon, and a connector mounting method for mounting the connector on a garment.

A sheet type conductive member according to the present invention is one that is attached to a connector mounted on a mounting object and that electrically connects a wiring portion of the mounting object to a contact of the connector, the sheet type conductive member comprising:
  a sheet body having an insulating property; and
  a flexible conductor formed of a conductive thread embroidered on or woven into the sheet body so as to be exposed on a surface of the sheet body, the flexible conductor extending along the surface of the sheet body,
  wherein the flexible conductor includes a first end portion disposed to be superposed on the wiring portion, a second end portion electrically connected to the contact, and a joint portion joining the first end portion and the second end portion together,
  the first end portion is electrically connected to the wiring portion by being sewed to the wiring portion,
  the sheet body has an opening portion used for attachment to the connector, and
  the second end portion extends from its connection portion with the joint portion toward an edge of the opening portion and is disposed near the opening portion to be spaced from the edge by a predetermined distance.

A connector according to the present invention is one mounted on the mounting object, the connector comprising:
  the sheet type conductive member according to claim 1;
  the contact electrically connected to the second end portion of the sheet type conductive member; and
  a housing having an insulating property configured to retain the sheet type conductive member and the contact,
  wherein the connector is fitted to a counter connector in a fitting direction.

A garment according to the present invention is one on which the above-mentioned connector is mounted.

A connector mounting method according to the present invention is a method for mounting the above-mentioned connector on a garment, the connector mounting method comprising:
  positioning the sheet type conductive member with respect to the garment such that the first end portion of the sheet type conductive member is superposed on the wiring portion of the garment; and
  sewing the first end portion to the wiring portion to thereby attach the sheet type conductive member to the garment and electrically connect the first end portion to the wiring portion.

DETAILED DESCRIPTION OF THE INVENTION

An embodiment of the present invention is described below with reference to the accompanying drawings.

Figure 1:
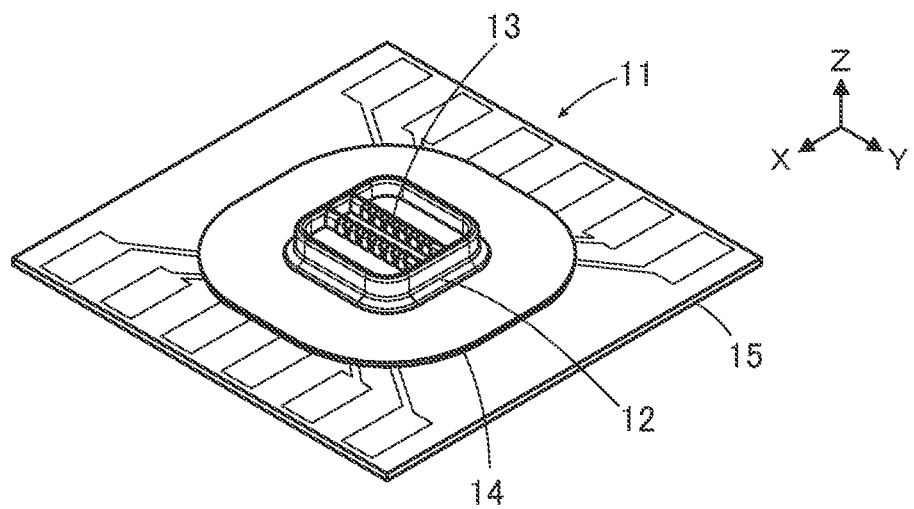
FIG. 1 is a perspective view showing a connector according to an embodiment.
Figure 2:
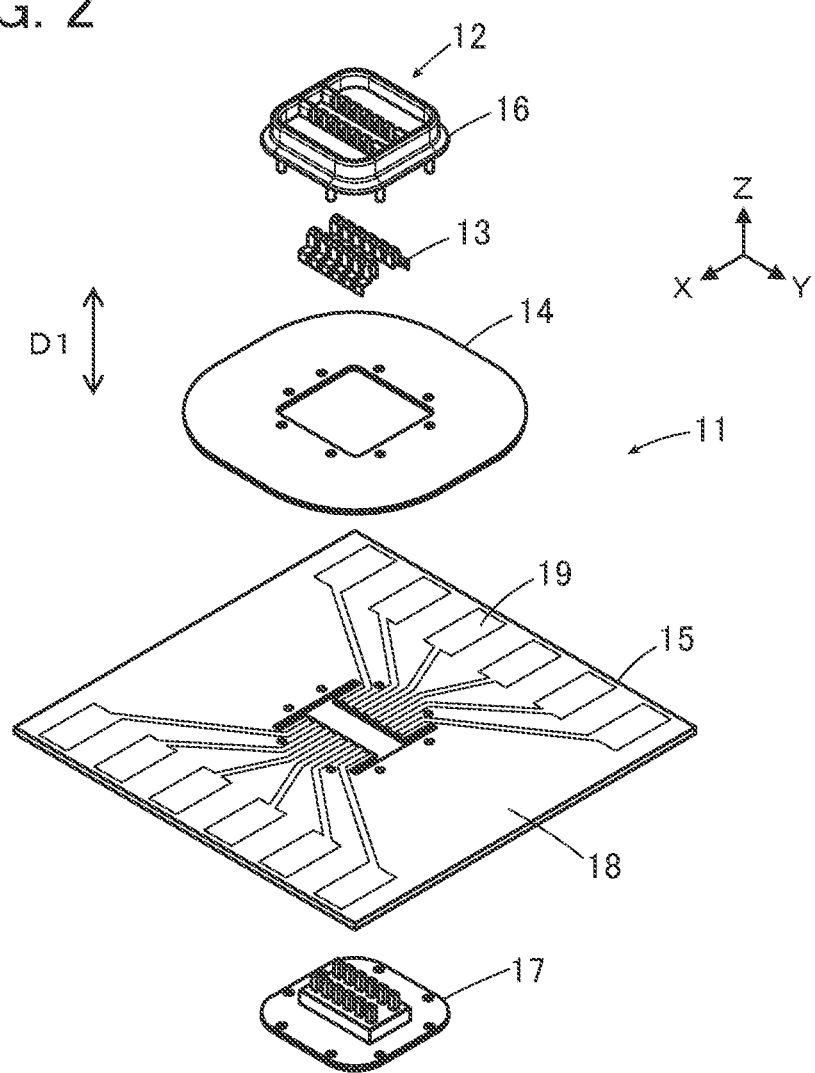
FIG. 2 is an exploded perspective view of the connector according to the embodiment, as viewed from an obliquely upper position.

FIGS. 1 and 2 show a connector 11 according to the embodiment. The connector 11 is mounted on a garment (mounting object) having a conductive wiring portion and is used as a connector for fitting a wearable device, for instance. The connector 11 includes a housing 12 made of an insulating material. A plurality of contacts 13 are retained in the housing 12, and a tab sheet 14 and a sheet type conductive member 15 being superposed on each other are retained by the housing 12.

The contacts 13 are arranged in two rows parallel to each other and disposed to project perpendicularly to the sheet type conductive member 15.

For convenience, the tab sheet 14 and the sheet type conductive member 15 are defined as extending in an XY plane, the arrangement direction of the contacts 13 is referred to as "Y direction," and the direction in which the contacts 13 project is referred to as "+Z direction." The Z direction is a fitting direction in which the connector 11 is fitted to a counter connector.

Figure 3:
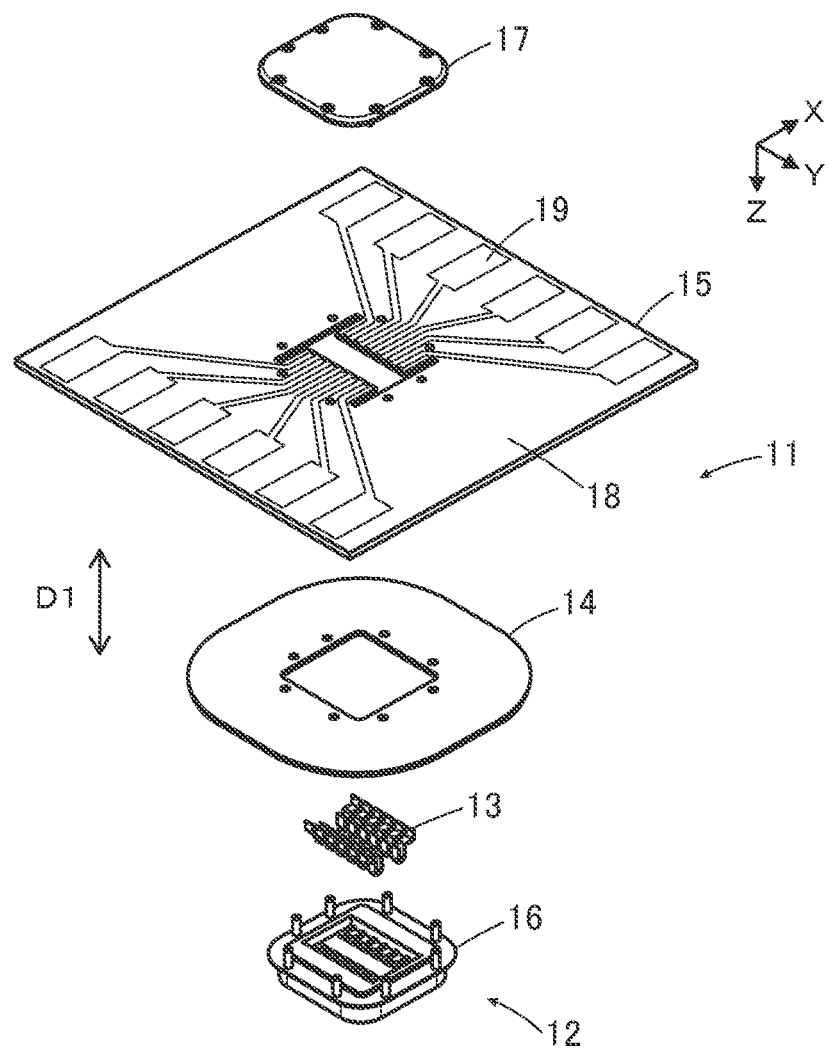
FIG. 3 is an exploded perspective view of the connector according to the embodiment, as viewed from an obliquely lower position.

FIGS. 2 and 3 are exploded perspective views of the connector 11. The connector 11 includes a first insulator 16 and a second insulator 17, and these first and second insulators 16 and 17 constitute the housing 12.

The contacts 13 are separately and temporarily retained in the first insulator 16, and the second insulator 17 is assembled to the first insulator 16 in the Z direction which is a predetermined assembling direction D1, with the second insulator 17 and the first insulator 16 sandwiching the sheet type conductive member 15 and the tab sheet 14 therebetween. The predetermined assembling direction D1 is the same as the fitting direction in which the connector 11 is fitted to a counter connector.

The sheet type conductive member 15 has a sheet body 18, and an embroidery pattern 19 embroidered on the sheet body 18 with embroidery threads. The embroidery pattern 19 is seen on both the front and back sides, facing the +Z and −Z directions, of the sheet type conductive member 15 as shown in FIGS. 2 and 3.

Figure 4:
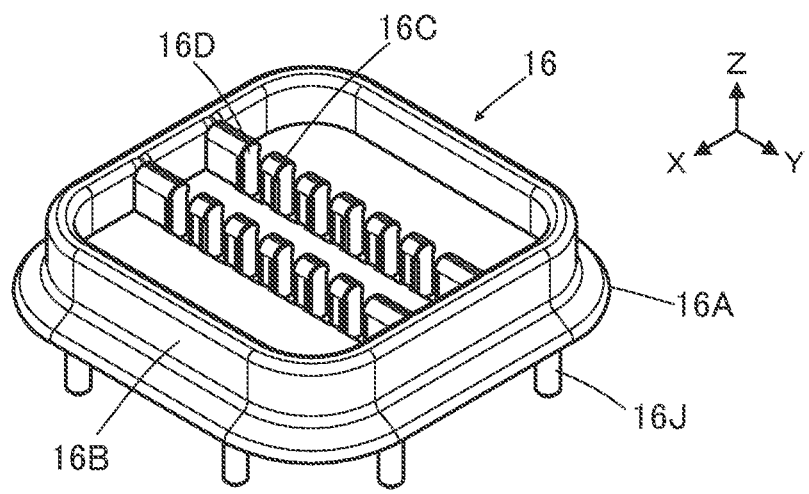
FIG. 4 is a perspective view of a first insulator used in the connector according to the embodiment, as viewed from an obliquely upper position.
Figure 5:
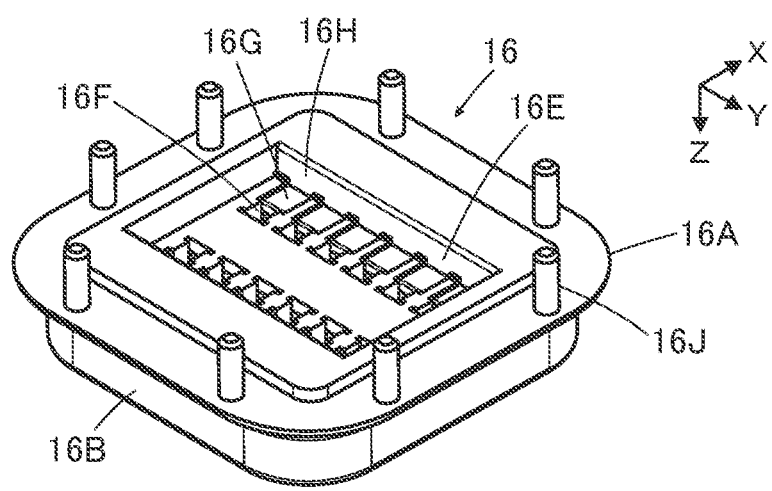
FIG. 5 is a perspective view of the first insulator used in the connector according to the embodiment, as viewed from an obliquely lower position.

As shown in FIGS. 4 and 5, the first insulator 16 includes a base portion 16A of flat rectangular shape extending in an XY plane, a peripheral wall portion 16B projecting in the +Z direction from the circumferential edge portion of the base portion 16A, and a plurality of projection portions 16C projecting in the +Z direction from a surface of the base portion 16A and arranged in two rows parallel to each other within the region surrounded by the peripheral wall portion 16B. A gap 16D is formed between each adjacent pair of projection portions 16C.

A recess portion 16E of rectangular shape that opens in the −Z direction is formed at the −Z direction-side surface of the base portion 16A, and the bottom of the recess portion 16E is provided with a plurality of through-holes 16F penetrating from the corresponding gaps 16D on the +Z direction side of the base portion 16A to the recess portion 16E. The through-holes 16F correspond to the contacts 13 and are arranged in two rows parallel to each other.

The bottom of the recess portion 16E is provided with a plurality of retaining surfaces 16G adjacent to the through-holes 16F in the X direction. Each retaining surface 16G flatly extends in an XY plane between the corresponding through-hole 16F and an inner wall surface 16H, facing the X direction, of the recess portion 16E.

The inner wall surfaces 16H, facing the X direction, of the recess portion 16E each constitute a first opposed surface extending in the Z direction that is the fitting direction.

Further, the −Z direction-side surface of the base portion 16A is provided with a plurality of fixing posts 16J projecting in the −Z direction.

Figure 6:
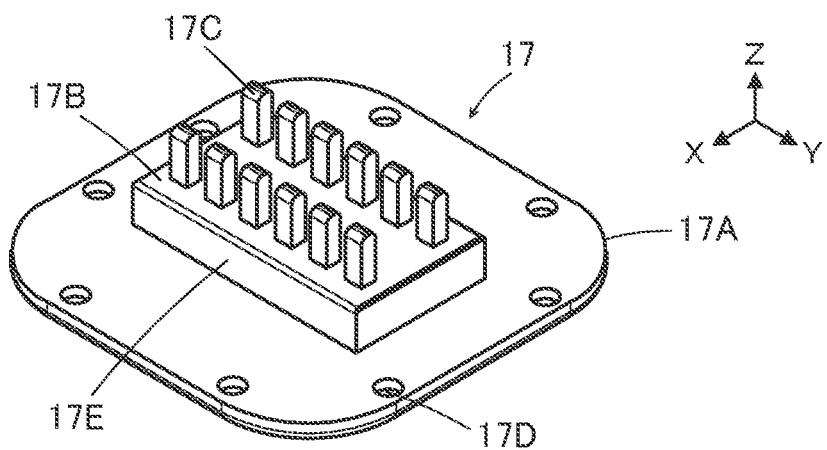
FIG. 6 is a perspective view of a second insulator used in the connector according to the embodiment, as viewed from an obliquely upper position.
Figure 7:
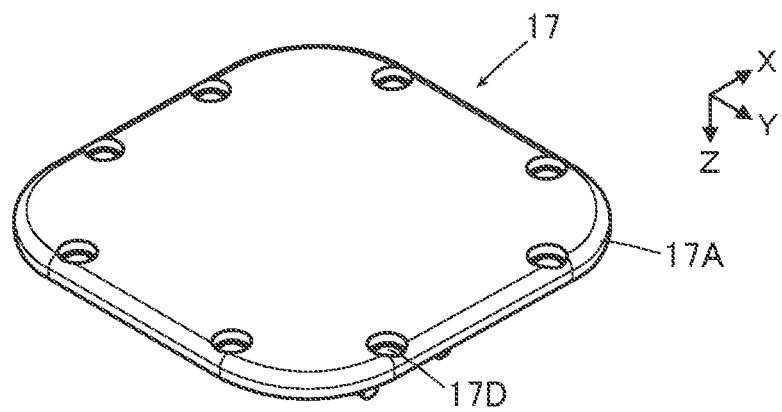
FIG. 7 is a perspective view of the second insulator used in the connector according to the embodiment, as viewed from an obliquely lower position.

As shown in FIGS. 6 and 7, the second insulator 17 includes a base portion 17A of flat plate shape extending in an XY plane, a jut portion 17B of cuboid shape situated in the center of the base portion 17A and projecting in the +Z direction from the base portion 17A, and a plurality of columnar members 17C projecting in the +Z direction from the jut portion 17B.

The jut portion 17B is inserted into the recess portion 16E of the first insulator 16 in assembling with the first insulator 16, and has a size slightly smaller than that of the recess portion 16E.

The columnar members 17C correspond to the contacts 13 and are arranged in two rows parallel to each other.

The base portion 17A is provided with a plurality of through-holes 17D situated around the jut portion 17B and penetrating through the base portion 17A in the Z direction. Those through-holes 17D correspond to the fixing posts 16J of the first insulator 16.

Outer surfaces 17E, facing the X direction, of the jut portion 17B each constitute a second opposed surface extending in the Z direction that is the fitting direction.

Figure 8:
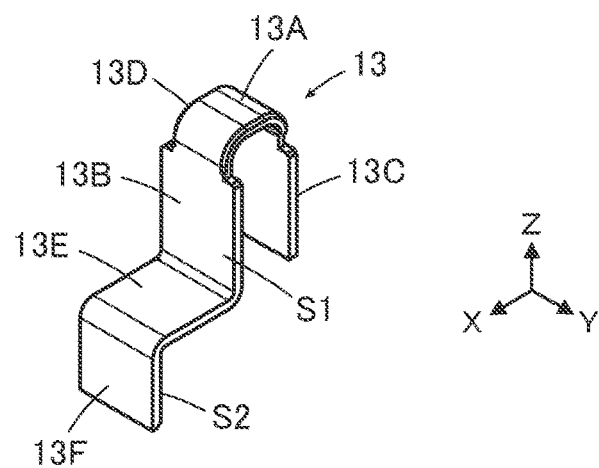
FIG. 8 is a perspective view of a contact used in the connector according to the embodiment, as viewed from an obliquely upper position.
Figure 9:
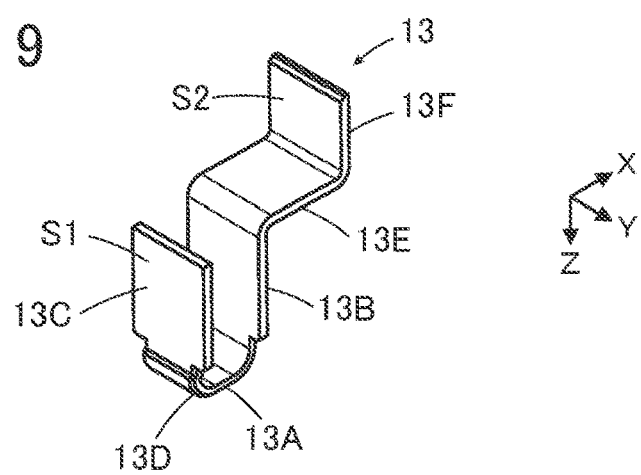
FIG. 9 is a perspective view of the contact used in the connector according to the embodiment, as viewed from an obliquely lower position.

FIGS. 8 and 9 show the structure of each of the contacts 13 arranged on the +X direction side, of the plurality of contacts 13 shown in FIGS. 2 and 3.

The contact 13 is constituted of a plug type contact formed of a band-shaped member made of a conductive material such as metal and includes a U-shaped portion 13A extending in the Z direction and bent in a U shape. The U-shaped portion 13A is composed of a pair of extension portions 13B and 13C extending along a YZ plane and facing each other in the X direction and a top portion 13D joining the +Z directional ends of the extension portions 13B and 13C to each other. The −Z directional end of the extension portion 13B is connected to a flat plate portion 13F extending in a YZ plane via a retained portion 13E extending in an XY plane.

An outer surface of the U-shaped portion 13A forms a contacting portion S1 that is to make contact with a contact of a counter connector, and a surface, on the −X direction side, of the flat plate portion 13F forms a connection portion S2 that is to make contact with a surface of the sheet type conductive member 15.

When the contact 13 is retained in the housing 12 shown in FIGS. 2 and 3, the contacting portion S1 of the contact 13 projects in the +Z direction from the housing 12, while the connection portion S2 of the contact 13 is situated inside the housing 12.

Note that, of the plurality of contacts 13 shown in FIGS. 2 and 3, the contacts 13 arranged on the −X direction side have the same structure as that of the contact 13 shown in FIGS. 8 and 9 but are disposed in the opposite orientation in the X direction.

Figure 10:
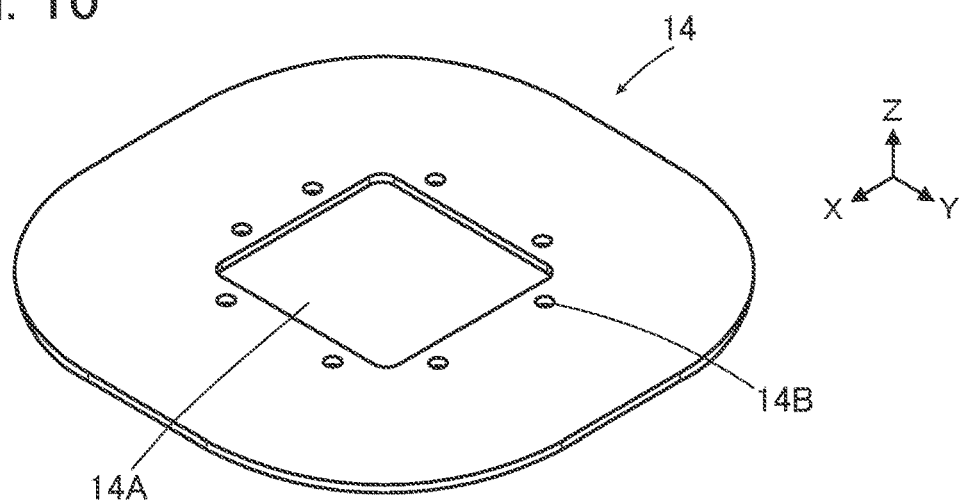
FIG. 10 is a perspective view showing a tab sheet used in the connector according to the embodiment.

As shown in FIG. 10, the tab sheet 14 is used for attaching the connector 11 to a garment by fixing the tab sheet 14 to the garment by sewing or other means. The tab sheet 14 is made of an insulating material such as resin or cloth, and has a size larger than that of the base portion 16A of the first insulator 16 and that of the base portion 17A of the second insulator 17 in an XY plane.

A substantially square opening portion 14A is formed in a central portion of the tab sheet 14. When the first insulator 16 and the second insulator 17 are assembled together, a portion of the tab sheet 14 around the opening portion 14A is, along with the sheet type conductive member 15, sandwiched between the base portion 16A of the first insulator 16 and the base portion 17A of the second insulator 17, and at this time, the jut portion 17B and the columnar members 17C of the second insulator 17 are inserted into the opening portion 14A.

A plurality of through-holes 14B are formed around the opening portion 14A of the tab sheet 14. Those through-holes 14B correspond to the fixing posts 16J of the first insulator 16.

Figure 11:
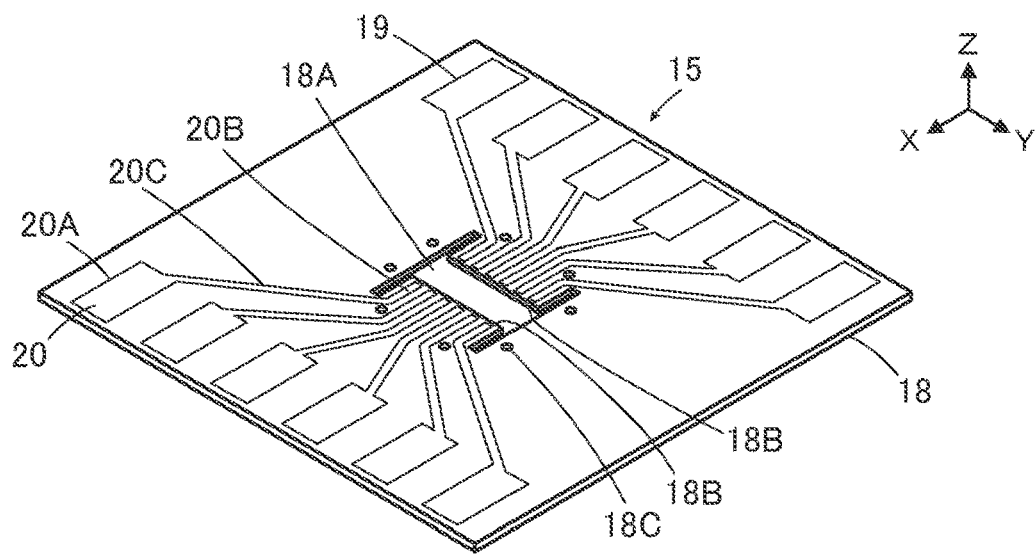
FIG. 11 is a perspective view showing a sheet type conductive member used in the connector according to the embodiment.

The sheet type conductive member 15 is used for electrically connecting a plurality of wiring portions of a garment on which the connector 11 is mounted, to the contacts 13. As shown in FIG. 11, the sheet type conductive member 15 includes: the sheet body 18 formed of insulating cloth or knitted fabric; and the embroidery pattern 19 embroidered on the sheet body 18 with embroidery threads.

The sheet body 18 has a substantially square shape, extends in an XY plane, and has an H-shaped opening portion 18A in its central portion. The opening portion 18A is used when the sheet type conductive member 15 is attached to the connector 11, and the opening portion 18A is provided with a pair of protrusion pieces 18B that are formed of part of the sheet body 18 and protrude to face each other in the X direction inside the opening portion 18A.

A plurality of through-holes 18C are formed around the opening portion 18A of the sheet body 18. Those through-holes 18C correspond to the fixing posts 16J of the first insulator 16.

Of the embroidery threads forming the embroidery pattern 19, a conductive thread is used only for a part exposed on the surface of the sheet body 18 on the +Z direction side, while an insulating thread is used for a part exposed on the surface of the sheet body 18 on the −Z direction side. A flexible conductor 20 exposed on the surface of the sheet type conductive member 15 on the +Z direction side is thus formed. In other words, the flexible conductor 20 is formed by embroidery using a conductive thread.

The sheet type conductive member 15 includes a plurality of flexible conductors 20 disposed on the +X direction side of the opening portion 18A of the sheet body 18 and a plurality of flexible conductors 20 disposed on the −X direction side of the opening portion 18A.

Each flexible conductor 20 includes a first end portion 20A disposed near a side, extending in the Y direction, of the square sheet body 18, a second end portion 20B disposed on the protrusion piece 18B of the sheet body 18, and a joint portion 20C joining the first end portion 20A and the second end portion 20B together. When the connector 11 is mounted on a garment, the first end portion 20A is connected to the corresponding wiring portion of the garment, and the second end portion 20B is connected to the corresponding contact 13 of the connector 11.

The second end portions 20B of the flexible conductors 20 disposed on the +X direction side of the opening portion 18A of the sheet body 18 and those disposed on the −X direction side of the opening portion 18A of the sheet body 18 are arranged in two rows on the opposite sides of the opening portion 18A to face each other across the opening portion 18A.

Figure 12:
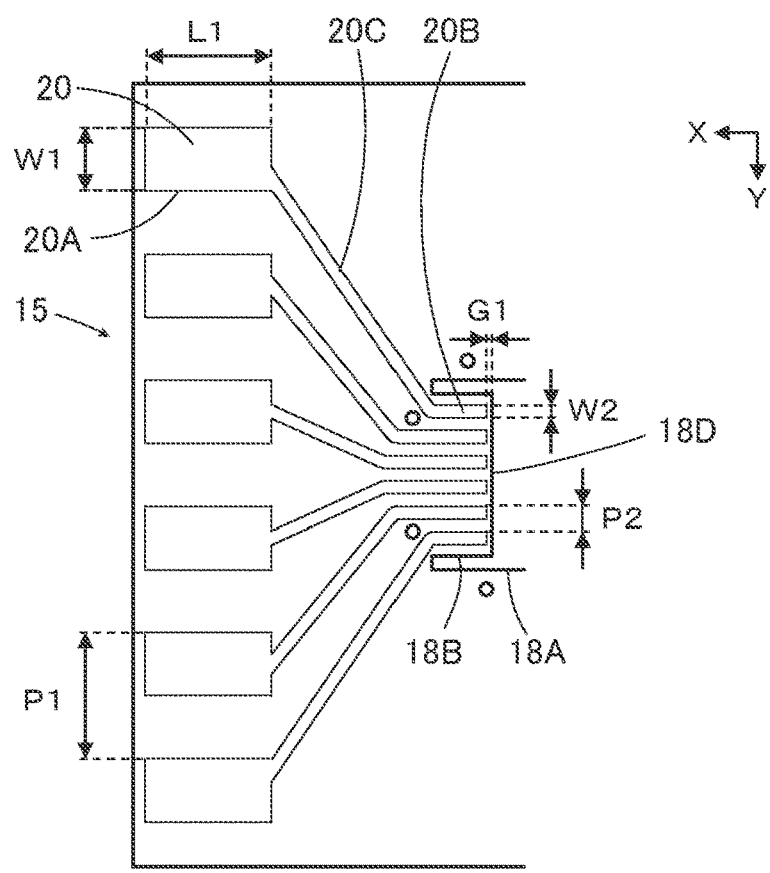
FIG. 12 is a partial plan view showing the sheet type conductive member used in the connector according to the embodiment.

As shown in FIG. 12, in the flexible conductors 20 disposed on the +X direction side of the opening portion 18A of the sheet body 18, the first end portions 20A are linearly arranged in the Y direction with first arrangement pitch P1, and the second end portions 20B are linearly arranged in the Y direction with second arrangement pitch P2 in parallel to the first end portions 20A. The second arrangement pitch P2 of the second end portions 20B corresponds to arrangement pitch of the contacts 13 in the Y direction.

The first arrangement pitch P1 of the first end portions 20A is set larger than the second arrangement pitch P2 of the second end portions 20B.

In addition, a width W1, in the Y direction, of the first end portion 20A of each flexible conductor 20 is set larger than a width W2, in the Y direction, of the second end portion 20B, and the joint portion 20C has the same width as that of the second end portion 20B.

In other words, the first end portions 20A are arranged in the Y direction with the first arrangement pitch P1 larger than the arrangement pitch of the contacts 13, and thus, the first end portions 20A are configured such that a larger distance can be ensured between every two first end portions 20A adjacent in the Y direction even though the first end portions 20A have the width W1 larger than the width W2 of the second end portions 20B.

In addition, the first end portion 20A of each flexible conductor 20 has a length L1 in the X direction larger than the width W1 in the Y direction.

Figure 13:
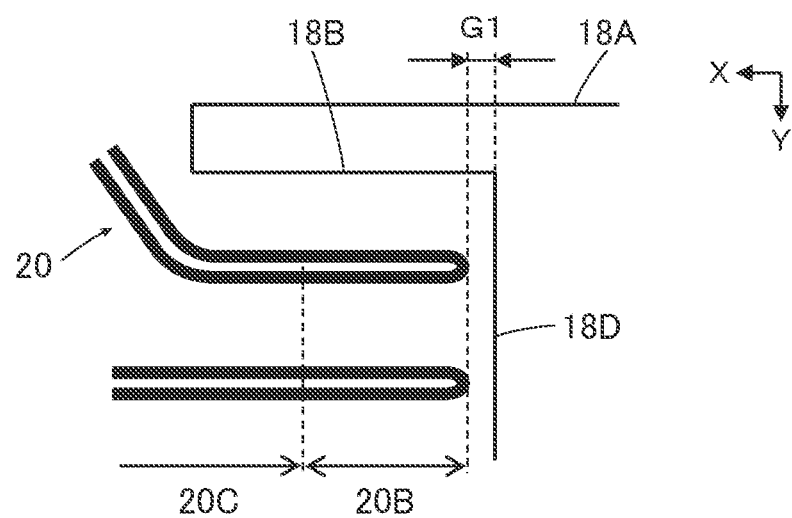
FIG. 13 is a plan view showing second end portions of flexible conductors of the sheet type conductive member used in the connector according to the embodiment.

Aside from that, the second end portions 20B are disposed to be spaced from a tip portion 18D, in the X direction, of the corresponding protrusion piece 18B by a predetermined distance G1, the tip portion 18D forming an edge of the opening portion 18A of the sheet body 18. For instance, the second end portion 20B situated on the +X direction side of the opening portion 18A of the sheet body 18 can be formed of a conductive thread embroidered so as to extend in the −X direction from its connection portion with the joint portion 20C toward the tip portion 18D, which is situated on the −X direction side, of the corresponding protrusion piece 18B and to turn back at the position away from the tip portion 18D by the predetermined distance G1 and extend in the +X direction toward the joint portion 20C, as shown in FIG. 13. Thus, the second end portion 20B is configured not to have a cut end formed by cutting the conductive thread.

Likewise, in the flexible conductors 20 disposed on the −X direction side of the opening portion 18A of the sheet body 18, the first end portions 20A are linearly arranged in the Y direction with the first arrangement pitch P1, and the second end portions 20B are linearly arranged in the Y direction with the second arrangement pitch P2 in parallel to the first end portions 20A.

Also likewise, in the flexible conductors 20 disposed on the −X direction side of the opening portion 18A of the sheet body 18, the first end portion 20A of each flexible conductor 20 has the width W1 in the Y direction larger than the width W2 of the second end portion 20B in the Y direction, the joint portion 20C has the same width as that of the second end portion 20B, and the first end portion 20A has the length L1 in the X direction larger than the width W1 in the Y direction.

Further, the second end portions 20B of the flexible conductors 20 situated on the −X direction side of the opening portion 18A of the sheet body 18 are also disposed to be spaced from the tip portion 18D, in the X direction, of the corresponding protrusion piece 18B by the predetermined distance G1 in the same manner as the second end portions 20B of the flexible conductors 20 situated on the +X direction side of the opening portion 18A of the sheet body 18. The second end portions 20B of the flexible conductors 20 situated on the −X direction side of the opening portion 18A of the sheet body 18 are also formed by embroidery to turn back at the position away from the tip portion 18D, in the X direction, of the corresponding protrusion piece 18B by the predetermined distance G1, so that the second end portions 20B can avoid having cut ends formed by cutting the conductive threads.

When the connector 11 is assembled, first, the respective contacts 13 are pushed into the first insulator 16 from the −Z direction toward the +Z direction, whereby the contacts 13 are temporarily retained in the first insulator 16. In this process, the U-shaped portion 13A of each contact 13 is passed through the corresponding through-hole 16F from the recess portion 16E on the −Z direction side of the first insulator 16 and inserted into the corresponding gap 16D formed between adjacent projection portions 16C, so that the contacting portion S1 formed of the outer surface of the U-shaped portion 13A is exposed on the +Z direction side of the first insulator 16.

The retained portion 13E and the flat plate portion 13F, which forms the connection portion S2, of each contact 13 are situated inside the recess portion 16E of the first insulator 16, and the flat plate portion 13F makes contact with the inner wall surface 16H of the recess portion 16E of the first insulator 16.

Now, the fixing posts 16J of the first insulator 16 are sequentially passed through the through-holes 14B of the tab sheet 14 and the through-holes 18C of the sheet type conductive member 15 such that the tab sheet 14 and the sheet type conductive member 15 lie on the −Z direction side of the first insulator 16. The fixing posts 16J of the first insulator 16 are further passed through the through-holes 17D of the second insulator 17, and the second insulator 17 is moved in the +Z direction toward the first insulator 16 to start the assembly into the first insulator 16.

In this process, the columnar members 17C of the second insulator 17 are each inserted into the inside of the U-shaped portion 13A of the corresponding contact 13 from the −Z direction.

Further, the jut portion 17B of the second insulator 17 is sequentially passed through the opening portion 18A of the sheet type conductive member 15 and the opening portion 14A of the tab sheet 14 from the −Z direction and then inserted into the recess portion 16E of the first insulator 16. In this process, the pair of protrusion pieces 18B situated inside the opening portion 18A of the sheet type conductive member 15 are pushed while being bent toward the +Z direction by the jut portion 17B of the second insulator 17 and each enter between the flat plate portion 13F of the contact 13 in contact with the inner wall surface 16H of the recess portion 16E of the first insulator 16 and the outer surface 17E of the jut portion 17B of the second insulator 17.

Figure 14:
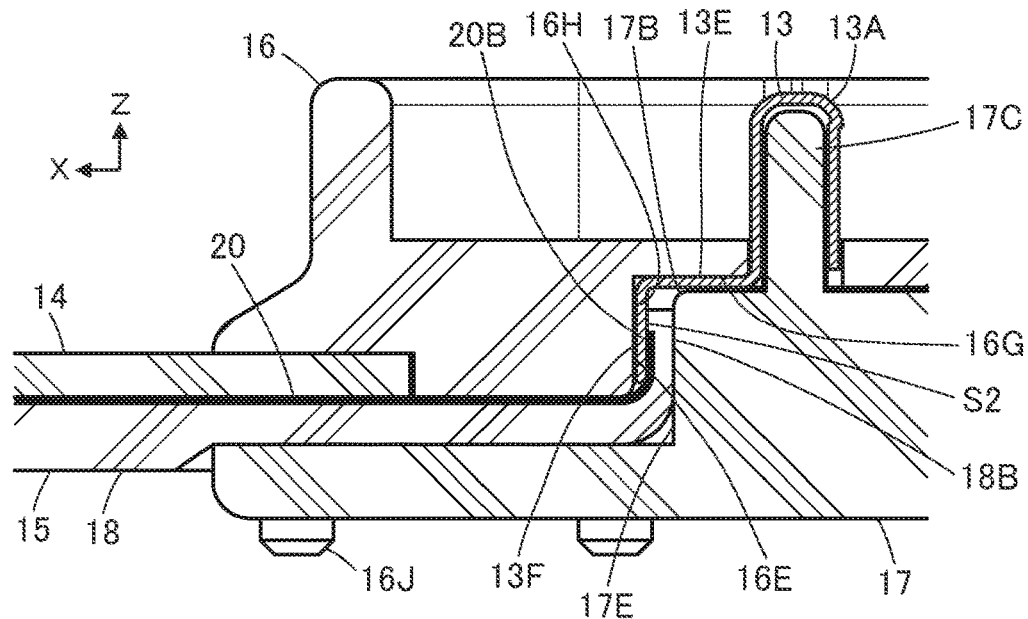
FIG. 14 is an enlarged cross-sectional view partially showing the connector according to the embodiment.

When the second insulator 17 is moved in the +Z direction toward the first insulator 16 with this state being kept, as shown in FIG. 14, the retained portion 13E of each contact 13 is sandwiched between the +Z direction-side surface of the jut portion 17B of the second insulator 17 and the retaining surface 16G inside the recess portion 16E of the first insulator 16. The contacts 13 are retained by the first insulator 16 and the second insulator 17 in this manner.

Further, the protrusion pieces 18B of the sheet body 18 of the sheet type conductive member 15 are pushed and bent toward the +Z direction by the jut portion 17B of the second insulator 17, and in this state, each protrusion piece 18B is sandwiched between the inner wall surface 16H, which constitutes the first opposed surface, of the recess portion 16E of the first insulator 16 and the outer surface 17E, which constitutes the second opposed surface, of the jut portion 17B of the second insulator 17, so that the second end portion 20B of each flexible conductor 20 exposed on the surface of the protrusion piece 18B makes contact at a predetermined contact pressure with the connection portion S2 of the flat plate portion 13F of the corresponding contact 13 being in contact with the inner wall surface 16H of the recess portion 16E of the first insulator 16. Thus, the contacts 13 are electrically connected to the second end portions 20B of the corresponding flexible conductors 20 of the sheet type conductive member 15.

As described above, the second end portions 20B of the flexible conductors 20 disposed on the corresponding protrusion piece 18B of the sheet type conductive member 15 are disposed to be spaced from the tip portion 18D of the protrusion piece 18B by the predetermined distance G1. Owing to this configuration, even if the tip of the second end portion 20B made of the conductive thread is frayed, adjacent contacts 13 do not easily short-circuit.

Moreover, in the case where the second end portions 20B of the flexible conductors 20 are each embroidered to turn back at the position away from the tip portion 18D of the corresponding protrusion piece 18B by the predetermined distance G1 as shown in FIG. 13 and do not have cut ends formed by cutting the conductive threads, adjacent contacts 13 can avoid short-circuiting via conductive fibers of frayed ends of the conductive threads when the second end portions 20B of the flexible conductors 20 are brought into contact with the connection portions S2 of the contacts 13 with a predetermined contact pressure. Thus, the second end portions 20B of the flexible conductors 20 can be electrically connected to the contacts 13 with good reliability.

The fixing posts 16J of the first insulator 16 are passed through the corresponding through-holes 17D of the second insulator 17 and project on the −Z direction side of the second insulator 17.

The −Z directional ends of the fixing posts 16J of the first insulator 16 that project on the −Z direction side of the second insulator 17 are heated and deformed whereby the second insulator 17 is fixed with respect to the first insulator 16.

The connector 11 shown in FIG. 1 is thus assembled.

Next, the method of mounting the connector 11 onto a garment 31 is described.

Figure 15:
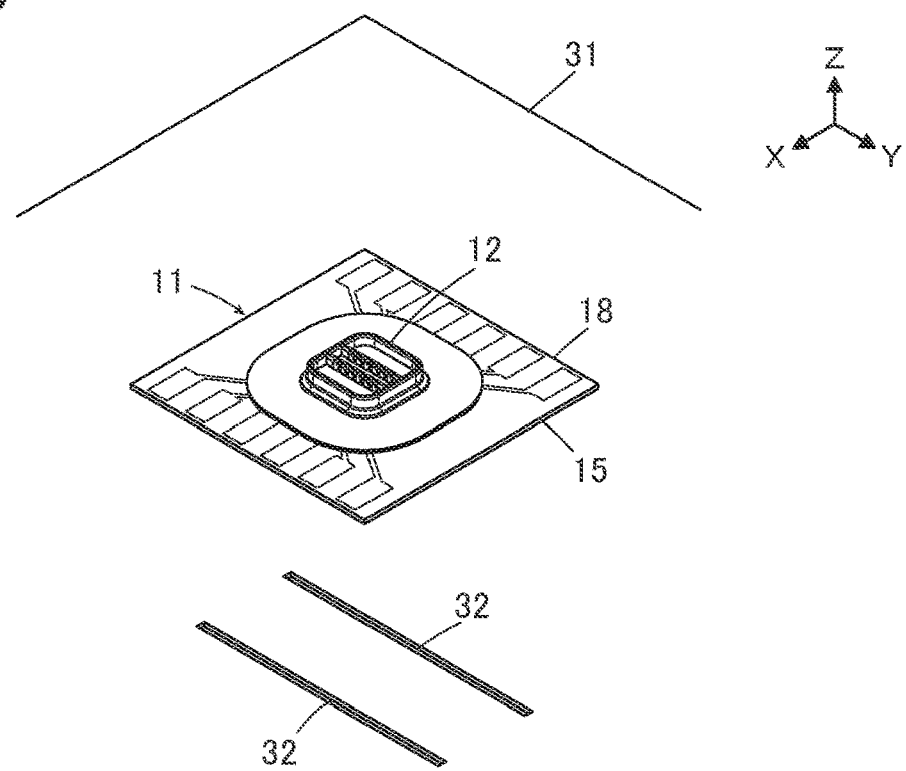
FIG. 15 is a perspective view showing the connector according to the embodiment that is positioned with respect to a surface of a garment.

Two slits 32 are formed in the garment 31 at a position where the connector 11 is to be attached, as shown in FIG. 15. The two slits 32 extend in the Y direction in parallel to each other with a distance therebetween in the X direction and penetrate the garment 31 from the front side to the back side. The two slits 32 have a length in the Y direction slightly larger than the Y directional length of the sheet type conductive member 15 of the connector 11 and are spaced apart from each other in the X direction with a distance slightly larger than the X directional length of the housing 12 of the connector 11.

After the connector 11 is positioned on the +Z direction side of the two slits 32 of the garment 31 thus configured, a portion of the sheet type conductive member 15 situated on the +X direction side of the housing 12 and a portion thereof situated on the −X direction side of the housing 12 are separately passed through the corresponding slits 32 and thereby drawn from the front side toward the back side of the garment 31.

Figure 16:
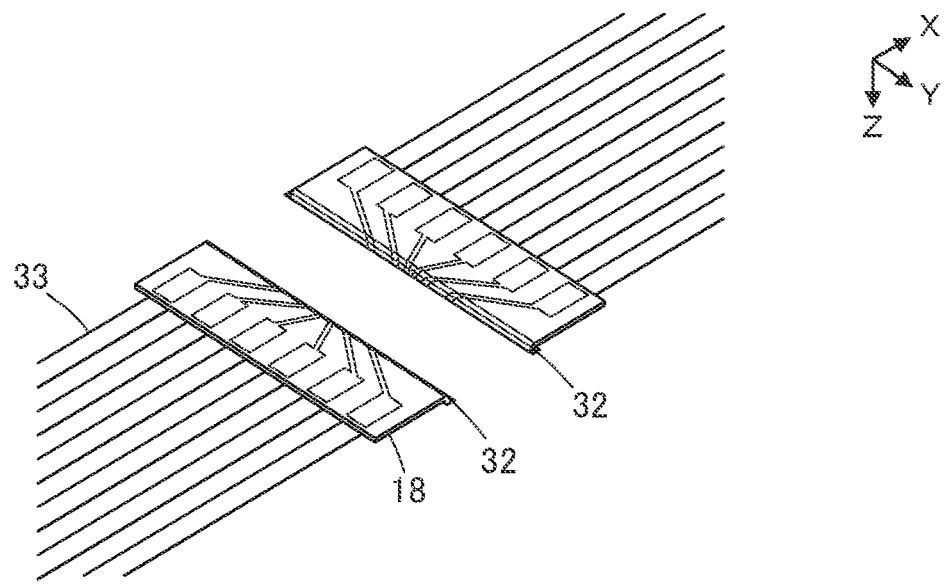
FIG. 16 is a perspective view showing the state where first end portions of flexible conductors of the connector according to the embodiment are superposed on wiring portions of the garment on the back side of the garment.

As shown in FIG. 16, the back side, facing the −Z direction, of the garment 31 is provided with a plurality of conductive wiring portions 33 separately extending in the +X and −X directions perpendicular to the two slits 32. One ends of those wiring portions 33 are arranged in the Y direction with the same arrangement pitch as that of the first end portions 20A of the sheet type conductive member 15 in the vicinity of the corresponding slit 32, and have the substantially same width in the Y direction as that of the first end portions 20A.

The wiring portions 33 are made of, for example, a conductive thread sewn into the garment 31, and at least their surfaces facing the −Z direction have conductivity. The other ends of the wiring portions 33 each extend along the back side of the garment 31 up to an electrode (not shown) attached to the garment 31.

The +X directional portion and the −X directional portion of the sheet type conductive member 15 drawn to the back side, facing the −Z direction, of the garment 31 through the two slits 32 of the garment 31 are disposed to be superposed on the one ends of the wiring portions 33.

Figure 17:
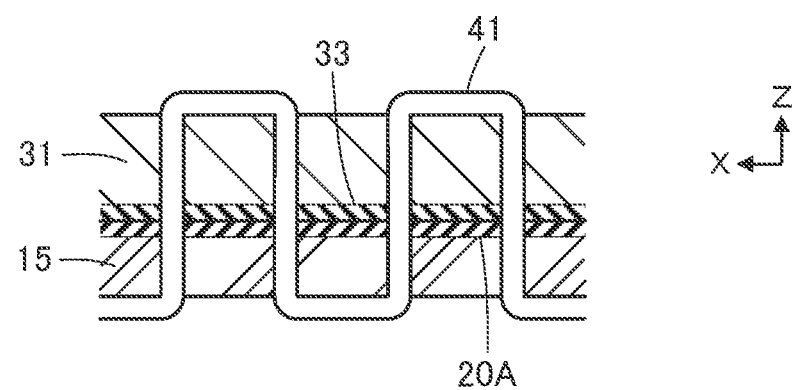
FIG. 17 is a cross-sectional side view showing a first end portion of the flexible conductor of the connector according to the embodiment, the first end portion being sewed to a wiring portion of the garment.

Since the one ends of the wiring portions 33 are arranged in the Y direction with the same arrangement pitch as that of the first end portions 20A of the sheet type conductive member 15, at this time, each first end portion 20A of the sheet type conductive member 15 is superposed on the −Z direction side of the corresponding wiring portion 33 of the garment 31 as shown in FIG. 17.

Then, the garment 31 and the sheet type conductive member 15 are sewed together with a sewing thread 41, whereby the first end portions 20A of the sheet type conductive member 15 can be electrically connected to the wiring portions 33 of the garment 31 on a one-to-one basis.

It should be noted that while the garment 31 and the sheet type conductive member 15 are sewed together with the sewing thread 41 in the form of so-called "running stitch" in FIG. 17, the sewing form is not limited thereto.

The width W1, in the Y direction, of the first end portion 20A of the sheet type conductive member 15 is set larger than the width W2, in the Y direction, of the second end portion 20B as shown in FIG. 12, and the wiring portion 33 of the garment 31 has substantially the same width in the Y direction as that of the first end portion 20A.

Hence, a large contact area can be ensured between the first end portion 20A and the wiring portion 33, so that the first end portion 20A can be electrically connected to the wiring portion 33 with high reliability.

Furthermore, since the width W1, in the Y direction, of the first end portion 20A of the sheet type conductive member 15 is larger than the width W2, in the Y direction, of the second end portion 20B, and the wiring portion 33 of the garment 31 has substantially the same width in the Y direction as that of the first end portion 20A, even when a little misalignment occurs in the Y direction between the first end portions 20A of the sheet type conductive member 15 and the wiring portions 33 of the garment 31 due to manufacturing tolerances of the sheet type conductive member 15 and the wiring portions 33 of the garment 31 or other reasons, the contact area can still be ensured between the first end portions 20A and the wiring portions 33, thus leading to reliable electrical connection therebetween.

Further, the tab sheet 14 of the connector 11 is also sewed on the garment 31 with the sewing thread 41, whereby the connector 11 can be fixed to the garment 31.

Since the first end portion 20A of the sheet type conductive member 15 and the wiring portion 33 of the garment 31 are superposed in the Z direction to make direct contact with each other as shown in FIG. 17, the sewing thread 41 used for sewing may be an insulating thread or a conductive thread.

However, when an insulating thread is used as the sewing thread 41, the plurality of first end portions 20A of the sheet type conductive member 15 can be sewed on the plurality of wiring portions 33 of the garment 31 with the sewing thread 41 all at once.

In the foregoing embodiment, a portion of the sheet type conductive member 15 situated on the +X direction side of the housing 12 and a portion thereof situated on the −X direction side of the housing 12 are separately passed through the corresponding slits 32 of the garment 31 and thereby drawn from the front side toward the back side of the garment 31; however, the invention is not limited thereto. For instance, the connector 11 shown in FIG. 15 can be simply disposed on the surface, facing the +Z direction, of the garment 31 and mounted on the garment 31 without having a portion of the sheet type conductive member 15 drawn to the back side of the garment 31.

Figure 18:
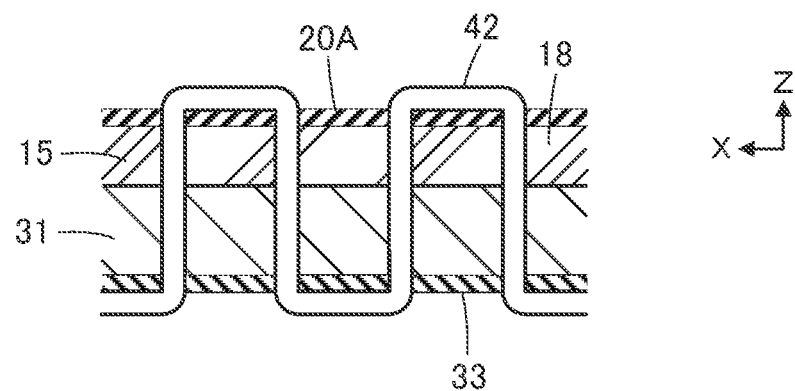
FIG. 18 is a cross sectional side view showing the first end portion of the flexible conductor of the connector according to a modification, the first end portion being sewed to the wiring portion of the garment.

At this time, when each first end portion 20A of the sheet type conductive member 15 is positioned right above the corresponding wiring portion 33 disposed on the back side of the garment 31, as shown in FIG. 18, the first end portion 20A is to be situated on the +Z direction side of the wiring portion 33 via the sheet body 18 of the sheet type conductive member 15 and the garment 31.

Then, the first end portion 20A is sewed through the sheet body 18 and the garment 31 to the wiring portion 33 with the sewing thread 42 having conductivity, whereby the first end portion 20A and the wiring portion 33 can be electrically connected via the sewing thread 42.

For instance, when the number of portions of the sewing thread 42 that penetrate the first end portion 20A and the wiring portion 33 is increased by reducing the stitch length of the sewing thread 42 in the first end portion 20A, the cross-sectional area of a conductive path between the first end portion 20A and the wiring portion 33 is increased, and highly reliable electrical connection can be obtained.

It should be noted that when the sewing thread 42 having conductivity is used, each first end portion 20A has to be sewed to the corresponding wiring portion 33 with an independent sewing thread 42 on a one-to-one basis in order to prevent a short between the plural first end portions 20.

Figure 19:
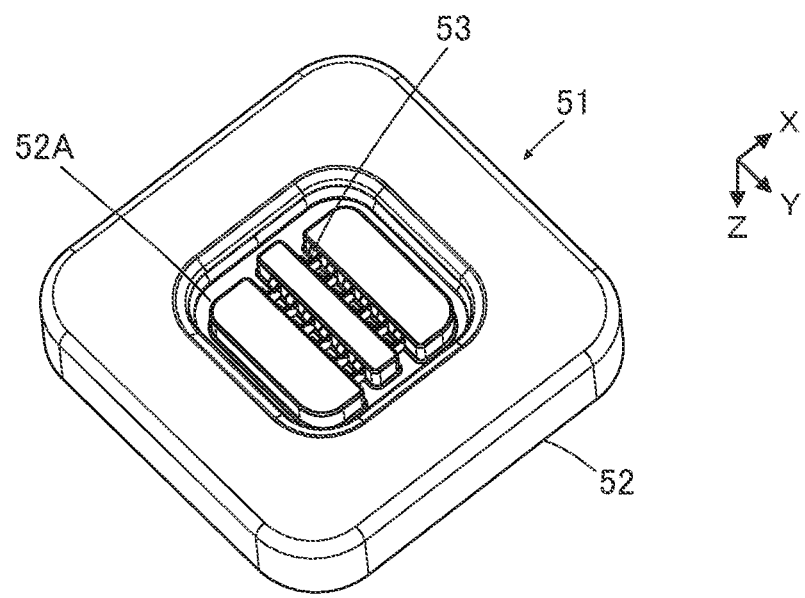
FIG. 19 is a perspective view showing a counter connector to be fitted to the connector according to the embodiment.

FIG. 19 shows a counter connector 51 to be fitted to the connector 11 according to the embodiment. The counter connector 51 includes a housing 52 made of an insulating material, and a plurality of contacts 53 are retained in the housing 52.

The contacts 53 correspond to the contacts 13 of the connector 11 and are arranged in two rows parallel to each other with the same arrangement pitch as that of the contacts 13. Each contact 53 faces the −Z direction and is a receptacle type contact corresponding to the plug type contact 13 of the connector 11.

A peripherally rounding groove 52A facing the −Z direction is formed in the housing 52 to surround the periphery of the contacts 53. The peripherally rounding groove 52A corresponds to the peripheral wall portion 16B of the first insulator 16 of the connector 11.

Figure 20:
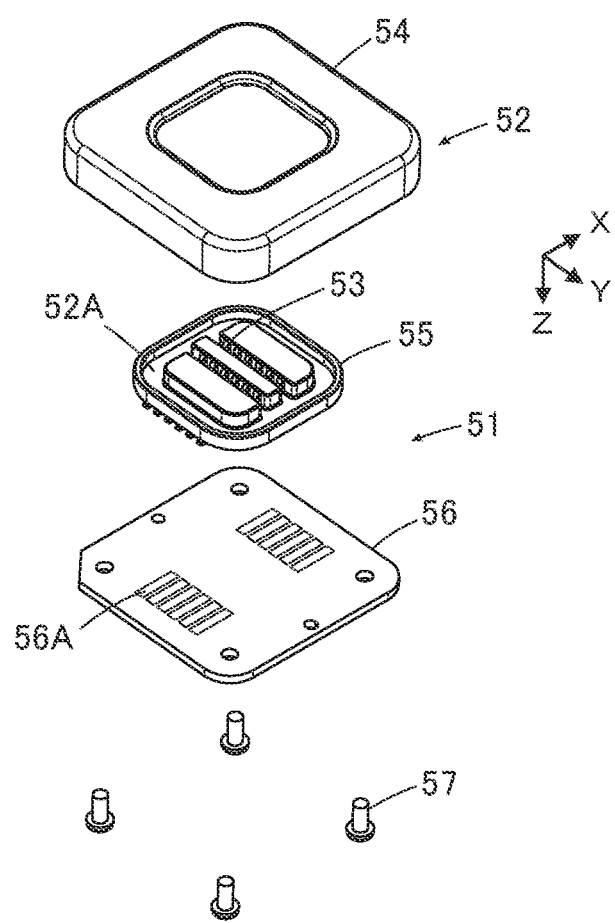
FIG. 20 is an exploded perspective view showing the counter connector.
Figure 21:
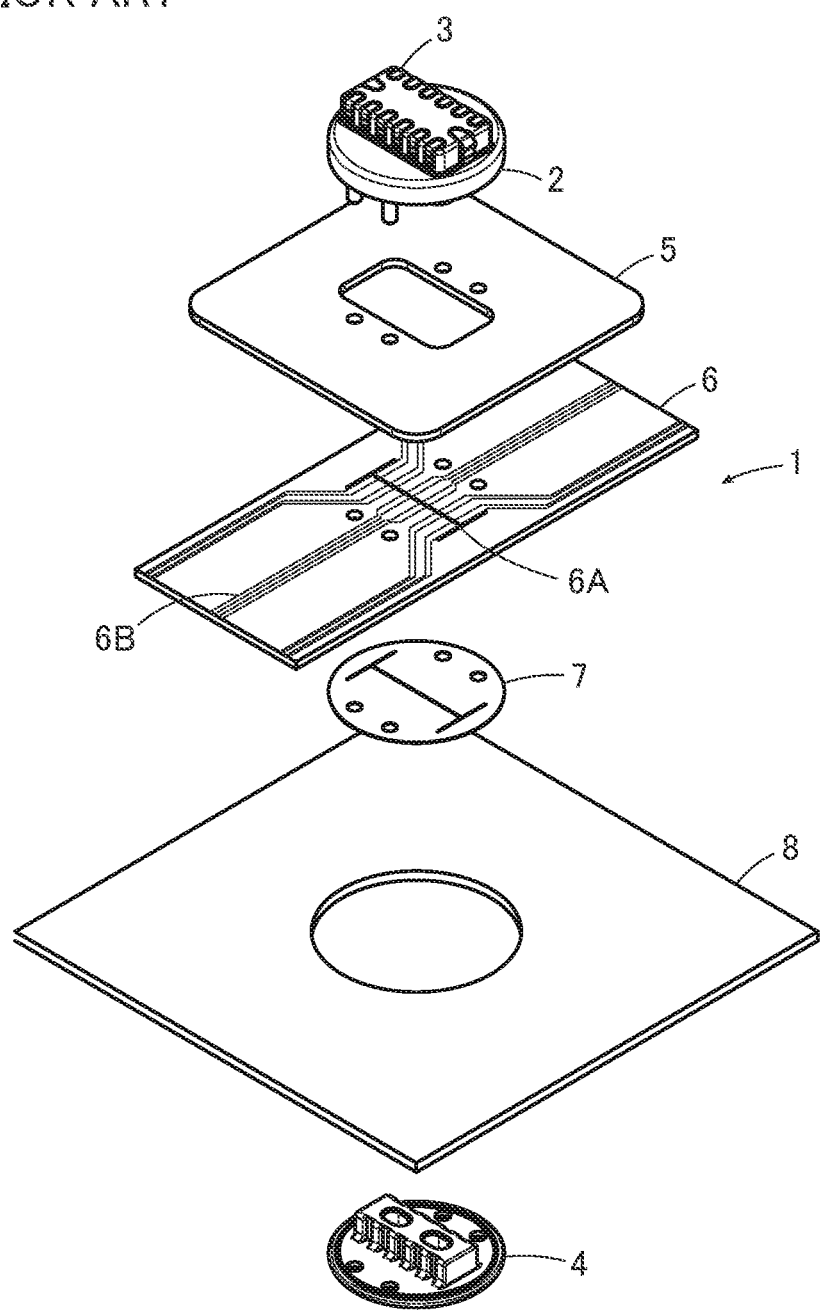
FIG. 21 is an exploded perspective view showing a conventional connector.

The counter connector 51 includes a first insulator 54 and a second insulator 55 as shown in FIG. 20, and these first and second insulators 54 and 55 constitute the housing 52.

The contacts 53 are retained in the second insulator and the peripherally rounding groove 52A is also formed in the second insulator 55.

The counter connector 51 further includes a circuit board 56, and a plurality of fixing screws 57 used to fix the circuit board 56 to the first insulator 54. The contacts 53 retained in the second insulator 55 are connected to a plurality of connection pads 56A of the circuit board 56 by soldering or another method, and the circuit board 56 is fixed to the first insulator 54 by means of the fixing screws 57. Thus, the counter connector 51 is assembled.

Components such as a wireless transmitting circuit (not shown) connected to the contacts 53 are mounted on a surface, facing the +Z direction, of the circuit board 56 opposite from the housing 52.

When the counter connector 51 as above is fitted to the connector 11 mounted on the garment 31 with the contacts 53 facing the −Z direction, the plug type contacts 13 of the connector 11 are inserted into the receptacle type contacts 53 of the counter connector 51 and electrically connected thereto. In addition, the peripheral wall portion 16B of the first insulator 16 of the connector 11 is inserted into the peripherally rounding groove 52A of the housing 52 of the counter connector 51, whereby the counter connector 51 is retained with respect to the connector 11.

Owing to the above configuration, user's biological data such as the heart rate and the body temperature as obtained using electrodes attached to the garment 31 can be input to the wireless transmitting circuit mounted on the circuit board 56 through the wiring portions 33 of the garment 31, the flexible conductors 20 of the sheet type conductive member 15 and the contacts 13 of the connector 11, and the contacts 53 of the counter connector 51, and wirelessly transmitted from the wireless transmitting circuit to a tablet terminal, a stationary measurement device, or the like.

While, in the connector 11 according to the embodiment described above, the contacts 13 are arranged in two rows parallel to each other, the invention is not limited thereto, and the contacts 13 may be arranged in one row. Further, this invention does not necessarily require the plurality of contacts 13, and it suffices if at least one contact 13 is provided.

In the embodiment above, as shown in FIG. 14, the flexible conductor 20 of the sheet type conductive member 15 is exposed on the surface of the sheet body 18 on the +Z direction side, the flat plate portion 13F of the contact 13 makes contact with the inner wall surface 16H of the recess portion 16E of the first insulator 16, the protrusion piece 18B of the sheet type conductive member 15 is sandwiched between the flat plate portion 13F of the contact 13 and the outer surface 17E of the jut portion 17B of the second insulator 17, and the second end portion 20B of the flexible conductor 20 exposed on the surface of the protrusion piece 18B is electrically connected to the contact 13; however, the invention is not limited thereto.

The flexible conductor 20 of the sheet type conductive member 15 may be exposed on the surface of the sheet body 18 on the −Z direction side. In this case, the flat plate portion 13F of the contact 13 is disposed to make contact with the outer surface 17E of the jut portion 17B of the second insulator 17, the protrusion piece 18B of the sheet type conductive member 15 is sandwiched between the flat plate portion 13F of the contact 13 and the inner wall surface 16H of the recess portion 16E of the first insulator 16, and the second end portion 20B of the flexible conductor 20 exposed on the surface of the protrusion piece 18B is electrically connected to the flat plate portion 13F of the contact 13.

For the sheet type conductive member 15 of the connector 11, both portions exposed on the surfaces of the sheet body 18 on the +Z direction side and the −Z direction side may be formed by embroidery using conductive threads, so that the flexible conductors 20 can be exposed on both surfaces of the sheet body 18.

Aside from that, while the flexible conductor 20 of the sheet type conductive member 15 is formed of a conductive thread embroidered on the sheet body 18 in the embodiment above, the invention is not limited thereto, and the flexible conductor 20 may be formed by weaving a conductive thread into the sheet body 18 made of insulating cloth or knitted fabric.

While in the connector 11 according to the embodiment above, the tab sheet 14 is disposed between the housing 12 and the sheet type conductive member 15, the tab sheet 14 may be omitted when it is not particularly necessary to reinforce the portion receiving the connector 11 when the connector 11 is mounted on the garment 31.

While the connector 11 is mounted on the garment 31 that is the mounting object in the embodiment above, the mounting object is not limited to the garment 31, and the connector 11 may be mounted on, for example, a bag that the user carries or wears, or a sheet, a bed or a bedding piece on or in which the user lies.

What is claimed is:

1. A sheet type conductive member that is attached to a connector mounted on a mounting object and that electrically connects a wiring portion of the mounting object to a contact of the connector, the sheet type conductive member comprising:
   a sheet body having an insulating property; and
   a flexible conductor formed of a conductive thread embroidered on or woven into the sheet body so as to be exposed on a surface of the sheet body, the flexible conductor extending along the surface of the sheet body,
   wherein the flexible conductor includes a first end portion disposed to be superposed on the wiring portion, a second end portion electrically connected to the contact, and a joint portion joining the first end portion and the second end portion together,
   the first end portion is electrically connected to the wiring portion by being sewed to the wiring portion,
   the sheet body has an opening portion used for attachment to the connector, and
   the second end portion extends from its connection portion with the joint portion toward an edge of the opening portion and is disposed near the opening portion to be spaced from the edge by a predetermined distance.

2. The sheet type conductive member according to claim 1,
   wherein the second end portion does not have a cut end formed by cutting the conductive thread.

3. The sheet type conductive member according to claim 2,
   wherein the second end portion is disposed near the opening portion to turn back at a position away from the edge by the predetermined distance.

4. The sheet type conductive member according to claim 1, comprising a plurality of the flexible conductors,
   wherein the first end portions of the plurality of the flexible conductors are linearly arranged with first arrangement pitch,
   the second end portions of the plurality of the flexible conductors are linearly arranged with second arrangement pitch in parallel to the first end portions of the plurality of the flexible conductors, and
   the first arrangement pitch is larger than the second arrangement pitch.

5. The sheet type conductive member according to claim 4,
   wherein the second end portions of the plurality of the flexible conductors are arranged in two rows on opposite sides of the opening portion to face each other across the opening portion.

6. The sheet type conductive member according to claim 5,
   wherein the sheet body has a protrusion piece protruding into the opening portion, and the second end portion of the flexible conductor is disposed on the protrusion piece to be spaced from a tip portion of the protrusion piece by the predetermined distance.

7. A connector mounted on the mounting object, the connector comprising:
   the sheet type conductive member according to claim 1;
   the contact electrically connected to the second end portion of the sheet type conductive member; and
   a housing having an insulating property configured to retain the sheet type conductive member and the contact,
   wherein the connector is fitted to a counter connector in a fitting direction.

8. The connector according to claim 7,
   wherein the housing includes a first insulator and a second insulator that are assembled to each other in a predetermined assembling direction while sandwiching the sheet type conductive member therebetween, and
   the contact includes a contacting portion and a connection portion, the contacting portion projecting in the fitting direction from the first insulator and being to make contact with a contact of the counter connector, and the connection portion being situated inside the housing and being connected to the second end portion of the flexible conductor of the sheet type conductive member.

9. The connector according to claim 8,
   wherein the first insulator includes a first opposed surface extending in the fitting direction,
   the second insulator includes a second opposed surface extending in the fitting direction and facing the first opposed surface, and
   the second end portion of the flexible conductor of the sheet type conductive member and the connection portion of the contact are sandwiched between the first opposed surface and the second opposed surface and, in this state, electrically connected to each other.

10. The connector according to claim 8,
    wherein the contact includes a retained portion situated between the contacting portion and the connection portion and retained by the housing by being sandwiched between the first insulator and the second insulator.

11. The connector according to claim 10,
    wherein the retained portion is sandwiched between the first insulator and the second insulator in the predetermined assembling direction.

12. The connector according to claim 8,
    wherein the predetermined assembling direction is same as the fitting direction.

13. The connector according to claim 8, comprising a tab sheet having an insulating property and sandwiched between the first insulator and the sheet type conductive member,
    wherein the tab sheet is sewed to the mounting object and thereby fixed to the mounting object.

14. A garment on which the connector according to claim 7 is mounted.

15. The garment according to claim 14,
    wherein the garment is provided with a slit through which a part of the sheet type conductive member is passed.

16. A connector mounting method for mounting the connector according to claim 7 on a garment, comprising:

positioning the sheet type conductive member with respect to the garment such that the first end portion of the sheet type conductive member is superposed on the wiring portion of the garment; and sewing the first end portion to the wiring portion to thereby attach the sheet type conductive member to the garment and electrically connect the first end portion to the wiring portion.

17. The connector mounting method according to claim 16, wherein the wiring portion is disposed on a back side of the garment, the second end portion of the sheet type conductive member is disposed on a front side of the garment, the first end portion of the sheet type conductive member is passed through a slit formed in the garment to be superposed on the wiring portion on the back side of the garment, and the first end portion is sewed to the wiring portion.

* * * * *